US012588365B2

(12) United States Patent
Lim et al.

(10) Patent No.: US 12,588,365 B2
(45) Date of Patent: Mar. 24, 2026

(54) DISPLAY APPARATUS AND METHOD OF MANUFACTURING THE SAME

(71) Applicant: SAMSUNG DISPLAY CO., LTD., Yongin-si (KR)

(72) Inventors: Taewoo Lim, Yongin-si (KR); Moonsoon Kim, Yongin-si (KR); Jaeseung Kim, Yongin-si (KR); Seunghui Seo, Yongin-si (KR); Moonkeun Choi, Yongin-si (KR); Sangbeom Han, Yongin-si (KR); Kipyo Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 694 days.

(21) Appl. No.: 17/829,486

(22) Filed: Jun. 1, 2022

(65) Prior Publication Data

US 2023/0101498 A1 Mar. 30, 2023

(30) Foreign Application Priority Data

Sep. 24, 2021 (KR) ........................ 10-2021-0126709

(51) Int. Cl.
*H01L 27/32* (2006.01)
*H10K 59/122* (2023.01)
(Continued)

(52) U.S. Cl.
CPC ........... *H10K 59/122* (2023.02); *H10K 71/00* (2023.02); *H10K 59/1201* (2023.02); *H10K 59/38* (2023.02); *H10K 2102/331* (2023.02)

(58) Field of Classification Search
CPC .. H10K 59/122; H10K 71/00; H10K 59/1201; H10K 59/38; H10K 2102/331;
(Continued)

(56) References Cited

U.S. PATENT DOCUMENTS 8,766,288 B2 7/2014 Chen et al.
11,004,835 B2 5/2021 Pschenitzka
(Continued)

FOREIGN PATENT DOCUMENTS

CN 105242448 A 1/2016
CN 105278155 A 1/2016
(Continued)

OTHER PUBLICATIONS

Hau-Vei Han et al: "Resonant-enhanced full-color emission of quantum-dot-based micro LED display technology", Optics Express, vol. 23, No. 25, Dec. 14, 2015 (Dec. 14, 2015), p. 32504, XP055388361.
(Continued)

*Primary Examiner* — Ermias T Woldegeorgis
(74) *Attorney, Agent, or Firm* — CANTOR COLBURN LLP

(57) ABSTRACT

A method of manufacturing a display apparatus, includes: discharging a first droplet including quantum dots into a first opening of a substrate; discharging a second droplet including quantum dots into a second opening of the substrate; and after discharging the first droplet and the second droplet, discharging a third droplet including scatterers into the first opening, the second opening, and a third opening of the substrate.

10 Claims, 11 Drawing Sheets

(51) Int. Cl.
     H10K 71/00      (2023.01)
     *H10K 59/12*      (2023.01)
     *H10K 59/38*      (2023.01)
     *H10K 102/00*      (2023.01)

(58) Field of Classification Search
     CPC .... H10K 71/135; H10K 50/125; H10K 50/85;
               B41J 2/2056; G02B 5/206; G02B 5/223
     See application file for complete search history.

(56)                References Cited

U.S. PATENT DOCUMENTS

| | | |
|---|---|---|
| 11,777,064 B2 | 10/2023 | Park et al. |
| 2003/0184613 A1* | 10/2003 | Nakamura ................. B41J 2/15 |
| | | 347/107 |
| 2007/0201056 A1 | 8/2007 | Cok et al. |
| 2008/0291228 A1 | 11/2008 | White et al. |
| 2018/0031911 A1 | 2/2018 | Liu |
| 2018/0102449 A1 | 4/2018 | Pschenitzka et al. |
| 2020/0365566 A1* | 11/2020 | Zhang ................. H01L 25/0753 |
| 2021/0074770 A1 | 3/2021 | Choe |

FOREIGN PATENT DOCUMENTS

| | | |
|---|---|---|
| CN | 112614957 A | 4/2021 |
| KR | 1020210031997 A | 3/2021 |
| KR | 1020210114080 A | 9/2021 |

OTHER PUBLICATIONS

The Extended European Search Report for EP Patent Application No. 22192825.2 dated Feb. 6, 2023; 10 pages.

\* cited by examiner

FIG. 9

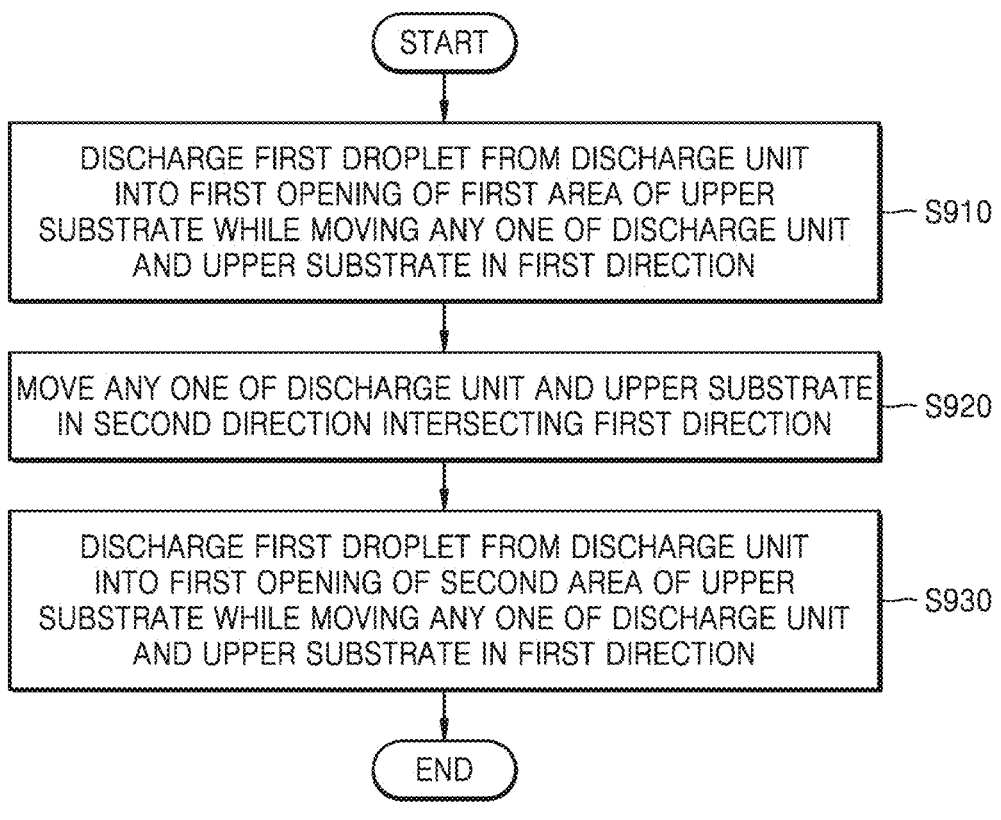

START

DISCHARGE FIRST DROPLET FROM DISCHARGE UNIT
INTO FIRST OPENING OF FIRST AREA OF UPPER
SUBSTRATE WHILE MOVING ANY ONE OF DISCHARGE UNIT
AND UPPER SUBSTRATE IN FIRST DIRECTION — S910

MOVE ANY ONE OF DISCHARGE UNIT AND UPPER SUBSTRATE
IN SECOND DIRECTION INTERSECTING FIRST DIRECTION — S920

DISCHARGE FIRST DROPLET FROM DISCHARGE UNIT
INTO FIRST OPENING OF SECOND AREA OF UPPER
SUBSTRATE WHILE MOVING ANY ONE OF DISCHARGE UNIT
AND UPPER SUBSTRATE IN FIRST DIRECTION — S930

END

1

DISPLAY APPARATUS AND METHOD OF MANUFACTURING THE SAME

This application claims priority to Korean Patent Application No. 10-2021-0126709, filed on Sep. 24, 2021, and all the benefits accruing therefrom under 35 U.S.C. § 119, the content of which in its entirety is herein incorporated by reference.

BACKGROUND

1. Field

One or more embodiments relate to a display apparatus and a method of manufacturing the same, and more particularly, to a display apparatus with a reduced possibility of occurrence of defects in a manufacturing process, and a method of manufacturing the display apparatus.

2. Description of the Related Art

A display apparatus has a plurality of pixels. In the case of a full-color display apparatus, the plurality of pixels may emit light of different colors. To this end, at least some pixels of the display apparatus have a color conversion unit. Accordingly, light of a first color generated by a light emitting unit of some pixels is converted into light of a second color while passing through a corresponding color conversion unit and is emitted.

SUMMARY

However, such a conventional display apparatus has a problem in that defects are highly likely to occur during a manufacturing process.

One or more embodiments include a display apparatus with a reduced possibility of occurrence of defects in a manufacturing process. However, this is merely an example, and the scope of the disclosure is not limited thereto.

Additional aspects will be set forth in part in the description which follows and, in part, will be apparent from the description, or may be learned by practice of the presented embodiments of the disclosure.

According to one or more embodiments, a method of manufacturing a display apparatus includes: discharging a first droplet including quantum dots into a first opening of a substrate; discharging a second droplet including quantum dots into a second opening of the substrate, and after discharging the first droplet and the second droplet, discharging a third droplet including scatterers into the first opening, the second opening, and a third opening of the substrate.

The first droplet or the second droplet may not include scatterers.

The discharging of the third droplet may include discharging different amounts of the third droplet into the first opening, the second opening, and the third opening, respectively.

The discharging of the third droplet may further include discharging the third droplet into the third opening in an amount greater than an amount of the third droplet discharged into each of the first opening and the second opening.

The first opening may be provided in plurality, and the discharging of the first droplet may include: discharging the first droplet from a discharge unit into the first opening of a first area of the substrate while moving any one of the discharge unit and the substrate in a first direction; after discharging the first droplet, moving any one of the discharge unit and the substrate in a second direction intersecting the first direction; and after moving the any one of the discharge unit and the substrate in the second direction, discharging the first droplet from the discharge unit into the first opening of a second area of the substrate while moving any one of the discharge unit and the substrate in the first direction.

The discharge unit may include a first nozzle and a second nozzle, the discharging of the first droplet into the first opening of the first area may include discharging the first droplet from the first nozzle of the discharge unit into the first opening of the first area of the substrate, and the discharging of the first droplet into the first opening of the second area may include discharging the first droplet from the second nozzle of the discharge unit into the first opening of the second area of the substrate.

The discharge unit may include a first nozzle and a second nozzle, the discharging of the third droplet may include discharging the third droplet from the first nozzle of the discharge unit into the first opening and the second opening of the substrate and discharging the third droplet from the second nozzle of the discharge unit into the third opening of the substrate.

According to one or more embodiments, a method of manufacturing a display apparatus includes: discharging a third droplet including scatterers through a first opening, a second opening, and a third opening of a substrate; after discharging the third droplet, discharging a first droplet including quantum dots into the first opening of the substrate; and after discharging the third droplet, discharging a second droplet including quantum dots into the second opening of the substrate.

According to one or more embodiments, a method of manufacturing a display apparatus includes: discharging a first droplet including quantum dots into a first opening of a substrate; after discharging the first droplet, discharging a third droplet including scatterers into the first opening, a second opening, and after discharging the third droplet, a third opening of the substrate; and discharging a second droplet including quantum dots into the second opening of the substrate.

According to one or more embodiments, a display apparatus includes: an upper substrate; a lower substrate on which first to third light-emitting devices are arranged and which is located below the upper substrate; a bank arranged between the upper substrate and the lower substrate and defining first to third openings corresponding to the first to the third light-emitting devices, respectively; a first resin layer located in the first opening and including a plurality of first scatterers, where the number of first scatterers per unit volume is different depending on a location in the first opening; a second resin layer located in the second opening and including a plurality of second scatterers, where the number of second scatterers per unit volume is different depending on a location in the second opening; and a third resin layer located in the third opening and including a plurality of third scatterers, where the number of third scatterers per unit volume is constant regardless of a location in the third opening.

The first scatterer, the second scatterer, and the third scatterer may include the same material.

The number of first scatterers per unit volume in the first resin layer may decrease in a direction from the lower substrate toward the upper substrate, and the number of second scatterers per unit volume in the second resin layer may decrease in the direction from the lower substrate toward the upper substrate.

The number of first scatterers per unit volume in a first-first portion of the first resin layer, located in a direction to the lower substrate, may be greater than the number of first scatterers per unit volume in a first-second portion of the first resin layer, located in a direction to the upper substrate, and the number of second scatterers per unit volume in a second-first portion of the second resin layer, located in the direction to the lower substrate, may be greater than the number of second scatterers per unit volume in a second-second portion of the second resin layer, located in the direction to the upper substrate.

The number of first scatterers per unit volume in a first-third portion between the first-first portion and the first-second portion of the first resin layer may decrease in the direction from the lower substrate toward the upper substrate, and the number of second scatterers per unit volume in a second-third portion between the second-first portion and the second-second portion of the second resin layer may decrease in the direction from the lower substrate toward the upper substrate.

The number of second scatterers per unit volume in the first resin layer may increase in the direction from the lower substrate toward the upper substrate, and the number of second scatterers per unit volume in the second resin layer may increase in the direction from the lower substrate toward the upper substrate.

The number of first scatterers per unit volume in the first-first portion of the first resin layer, located in the direction to the lower substrate, may be less than the number of first scatterers per unit volume in the first-second portion of the first resin layer, located in the direction to the upper substrate, and the number of second scatterers per unit volume in the second-first portion of the second resin layer, located in the direction to the lower substrate, may be less than the number of second scatterers per unit volume in the second-second portion of the second resin layer, located in the direction to the upper substrate.

The number of first scatterers per unit volume in the first-third portion between the first-first portion and the first-second portion of the first resin layer may increase in the direction from the lower substrate toward the upper substrate, and the number of first scatterers per unit volume in the second-third portion between the second-first portion and the second-second portion of the second resin layer may increase in the direction from the lower substrate toward the upper substrate.

The first resin layer may further include a plurality of first quantum dots, and the second resin layer may further include a plurality of second quantum dots.

The number of first quantum dots per unit volume in the first resin layer may increase in the direction from the lower substrate toward the upper substrate, and the number of second quantum dots per unit volume in the second resin layer may increase in the direction from the lower substrate toward the upper substrate.

The number of first quantum dots per unit volume in the first-first portion of the first resin layer, located in the direction to the lower substrate, may be less than the number of first quantum dots per unit volume in the first-second portion of the first resin layer, located in the direction to the upper substrate, and the number of second quantum dots per unit volume in the second-first portion of the second resin layer, located in the direction to the lower substrate, may be less than the number of second quantum dots per unit volume in the second-second portion of the second resin layer, located in the direction to the upper substrate.

The number of first quantum dots per unit volume in the first-third portion between the first-first portion and the first-second portion of the first resin layer may increase in the direction from the lower substrate toward the upper substrate, and the number of second quantum dots per unit volume in the second-third portion between the second-first portion and the second-second portion of the second resin layer may increase in the direction from the lower substrate toward the upper substrate.

The number of second quantum dots per unit volume in the first resin layer may decrease in the direction from the lower substrate toward the upper substrate, and the number of second quantum dots per unit volume in the second resin layer may quantum decrease in the direction from the lower substrate toward the upper substrate.

The number of first quantum dots per unit volume in the first-first portion of the first resin layer, located in the direction to the lower substrate, may be greater than the number of first quantum dots per unit volume in the first-second portion of the first resin layer, in the direction to the upper substrate, and the number of second quantum dots per unit volume in the second-first portion of the second resin layer, in the direction to the lower substrate, may be greater than the number of second quantum dots per unit volume in the second-second portion of the second resin layer, located in the direction to the upper substrate.

The number of first quantum dots per unit volume in the first-third portion between the first-first portion and the first-second portion of the first resin layer may decrease in the direction from the lower substrate toward the upper substrate, and the number of second quantum dots per unit volume in the second-third portion between the second-first portion and the second-second portion of the second resin layer may decrease in the direction from the lower substrate toward the upper substrate.

These and/or other aspects will become apparent and more readily appreciated from the following description of the embodiments, taken in conjunction with the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 9 is a flowchart illustrating a method of manufacturing a display apparatus according to an embodiment;

DETAILED DESCRIPTION

Figure 1:
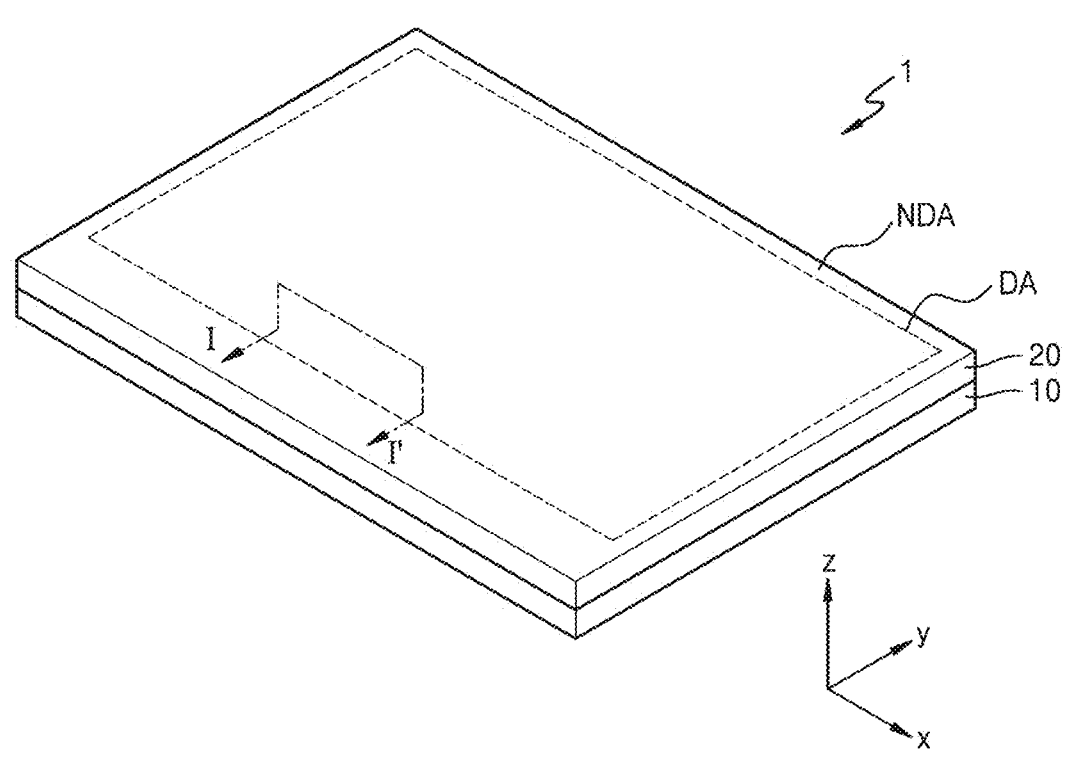
FIG. 1 is a perspective view of a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since the disclosure may have diverse modified embodiments, certain embodiments are illustrated in the drawings and are described in the detailed description. Advantages and features of the disclosure, and implementation methods thereof will be clarified through following embodiments described with reference to the accompanying drawings. The disclosure may, however, be embodied in many different forms and should not be construed as limited to the embodiments set forth herein.

Reference will now be made in detail to embodiments, examples of which are illustrated in the accompanying drawings, wherein like reference numerals refer to like elements throughout, and repeated description thereof will be omitted.

It will be understood that when a layer, region, or component is referred to as being "formed on" another layer, region, or component, it can be directly or indirectly formed on the other layer, region, or component. That is, for example, intervening layers, regions, or components may be present. Sizes of components in the drawings may be exaggerated for convenience of explanation. In other words, since sizes and thicknesses of components in the drawings are arbitrarily illustrated for convenience of explanation, the following embodiments are not limited thereto.

In the following embodiments, an x-axis, a y-axis, and a z-axis are not limited to three axes on an orthogonal coordinate system and may be widely understood. For example, the x-axis, the y-axis, and the z-axis may be perpendicular to one another or may represent different directions that are not perpendicular to one another.

It will be understood that although the terms "first," "second," etc. may be used herein to describe various elements, these elements should not be limited by these terms.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Figure 2:
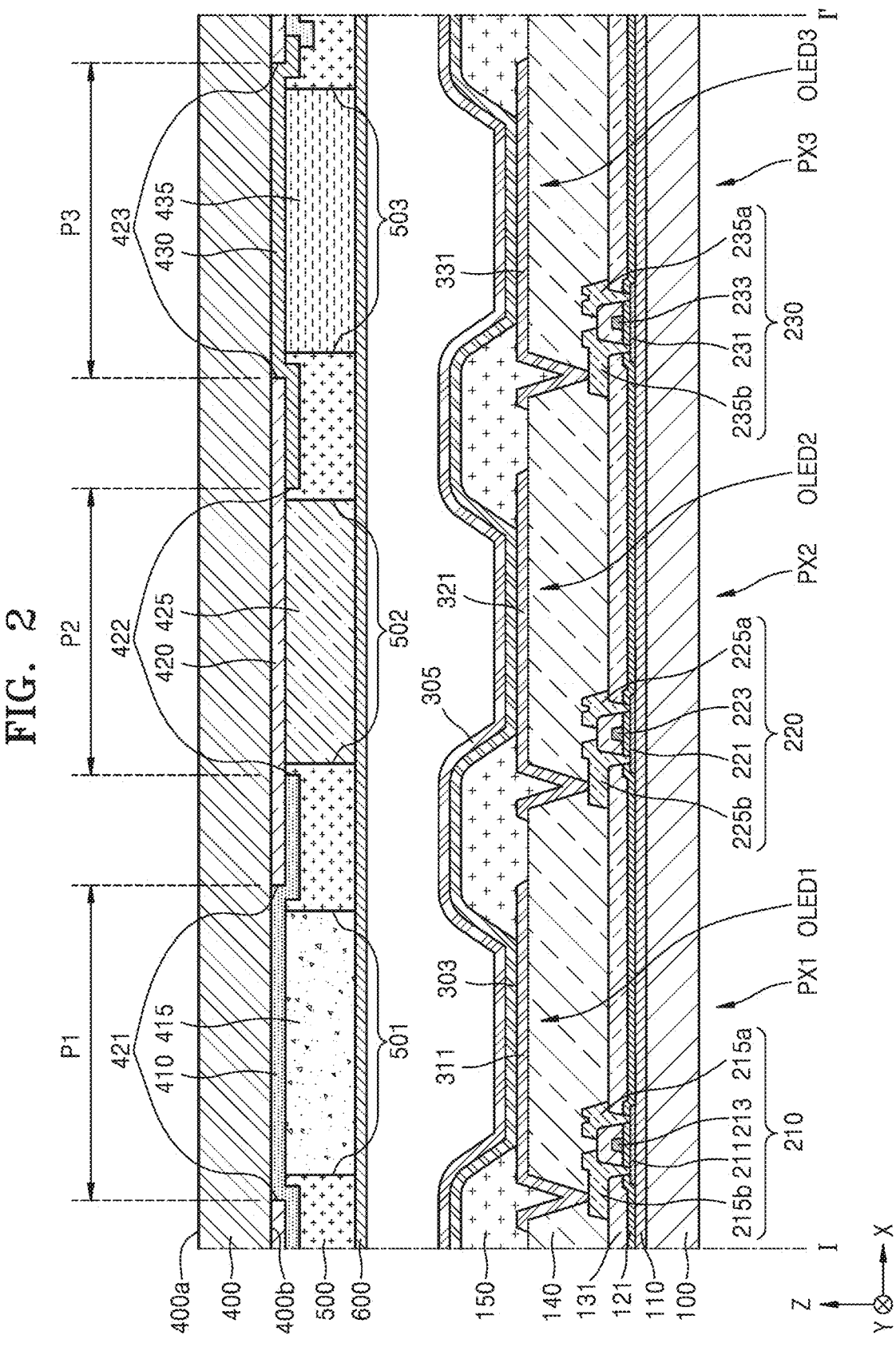
FIG. 2 is a cross-sectional view of the display apparatus of FIG. 1 taken along line I-I'.

FIG. 1 is a perspective view of a portion of a display apparatus 1 according to an embodiment, and FIG. 2 is a cross-sectional view of the display apparatus 1 of FIG. 1 taken along line I-I'.

Referring to FIG. 1, the display apparatus 1 may include a display area DA and a non-display area NDA surrounding the display area DA. The display apparatus 1 may provide an image through an array of a plurality of pixels that are two-dimensionally arranged in the display area DA.

Each pixel of the display apparatus 1 is an area capable of emitting light of a certain color, and the display apparatus 1 may provide an image using light emitted from pixels. For example, each pixel may emit red, green, or blue light.

The non-display area NDA is an area that does not provide an image and may surround the display area DA. A driver or a main power line for providing an electrical signal or power to pixel circuits may be arranged in the non-display area NDA. The non-display area NDA may include a pad, which is an area to which an electronic device or a printed circuit board may be electrically connected.

The display area DA may have a polygonal shape including a quadrangle as shown in FIG. 1. For example, the display area DA may have a rectangular shape with a horizontal length (e.g., in a x direction) greater than a vertical length (e.g., in a y direction), a rectangular shape with a horizontal length less than a vertical length, or a square shape. Alternatively, the display area DA may have various shapes such as an ellipse or a circle.

The display apparatus 1 may include a light emitting panel 10 and a color panel 20 stacked in a thickness direction (e.g., in a z direction). Light emitted from the light emitting panel 10 (e.g., blue light Lb) may be converted into red light Lr, green light Lg, and the blue light Lb or transmitted while passing through the color panel 20.

Referring to FIG. 2, the display apparatus 1 according to the present embodiment includes a lower substrate 100, a first pixel electrode 311, a second pixel electrode 321, and a third pixel electrode 331, a pixel-defining layer 150, an upper substrate 400, and a bank 500 arranged on the lower substrate 100.

The lower substrate 100 may include glass, metal, or a polymer resin. The lower substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

However, the lower substrate 100 may have a multilayer structure including two layers including the polymer resin, and a barrier layer including an inorganic material (such as silicon oxide, silicon nitride, silicon oxynitride, etc.) between the two layers, and various modifications thereof are possible.

The first pixel electrode 311, the second pixel electrode 321, and the third pixel electrode 331 are located on the lower substrate 100. On the lower substrate 100, in addition to the first pixel electrode 311, the second pixel electrode 321, and the third pixel electrode 331, a first thin-film transistor 210, a second thin-film transistor 220, and a third thin-film transistor 230 electrically connected thereto may also be located. That is, as shown in FIG. 2, the first pixel electrode 311 may be electrically connected to the first thin-film transistor 210, the second pixel electrode 321 may be electrically connected to the second thin-film transistor 220, and the third pixel electrode 331 may be electrically connected to the third thin-film transistor 230. The first pixel electrode 311, the second pixel electrode 321, and the third pixel electrode 331 may be located on a planarization layer 140 to be described later located on the lower substrate 100.

The first thin-film transistor 210 may include a first semiconductor layer 211 including amorphous silicon, polycrystalline silicon, an organic semiconductor material, or an oxide semiconductor material, a first gate electrode 213, a first source electrode 215a, and a first drain electrode 215b. The first gate electrode 213 may include various conductive materials and may have various layer structures. For example, the first gate electrode 213 may include a Mo layer and an Al layer. In this case, the first gate electrode 213 may have a layered structure of Mo/Al/Mo. Alternatively, the first gate electrode 213 may include a TiNx layer, an Al layer, and/or a Ti layer. The first source electrode 215a and the first drain electrode 215b may also include various conductive materials and have various layered structures, for example, a Ti layer, an Al layer, and/or a Cu layer. In this case, the first source electrode 215a and the first drain electrode 215b may have a layered structure of Ti/Al/Ti.

A gate insulating film 121 may be between the first semiconductor layer 211 and the first gate electrode 213 to insulate the first semiconductor layer 211 from the first gate electrode 213, the gate insulating film 121 including an inorganic material such as silicon oxide, silicon nitride, and/or silicon oxynitride. In addition, an interlayer-insulating layer 131 may be on the first gate electrode 213, the interlayer-insulating layer 131 including an inorganic material such as silicon oxide, silicon nitride, and/or silicon oxynitride. The first source electrode 215a and the first drain electrode 215b may be on the interlayer-insulating layer 131. An insulating layer including an inorganic material may be formed by chemical vapor deposition ("CVD") or atomic layer deposition ("ALD"). This also applies to the following embodiments and variations thereof.

A buffer layer 110 may be between the first thin-film transistor 210 and the lower substrate 100 having such a structure, the buffer layer 110 including an inorganic material such as silicon oxide, silicon nitride, and/or silicon oxynitride. The buffer layer 110 may increase smoothness of an upper surface of the lower substrate 100 or prevent or minimize impurities from the lower substrate 100 or the like from penetrating into the first semiconductor layer 211 of the first thin-film transistor 210.

The second thin-film transistor 220 located in a second pixel PX2 may include a second semiconductor layer 221, a second gate electrode 223, a second source electrode 225a, and a second drain electrode 225b. The third thin-film transistor 230 located in a third pixel PX3 may include a third semiconductor layer 231, a third gate electrode 233, a third source electrode 235a, and a third drain electrode 235b. Because a structure of the second thin-film transistor 220 and a structure of the third thin-film transistor 230 are the same as or similar to a structure of the first thin-film transistor 210 located in a first pixel PX1, a description thereof will not be given herein.

In addition, the planarization layer 140 may be arranged on the first thin-film transistor 210. For example, when a first light-emitting device OLED1 including the first pixel electrode 311 is arranged on the first thin-film transistor 210 as shown in FIG. 2, the planarization layer 140 may generally flatten an upper portion of a protective film covering the first thin-film transistor 210. The planarization layer 140 may include an organic material such as acryl, benzocyclobutene ("BCB"), or hexamethyldisiloxane ("HMDSO"). Although the planarization layer 140 is shown as a monolayer in FIG. 2, the planarization layer 140 may be a multilayer and various modifications are possible.

The first light-emitting device OLED1 having a first pixel electrode 311, an opposite electrode 305, and an intermediate layer 303 interposed therebetween and including a light-emitting layer may be located in the first pixel PX1. As shown in FIG. 1, the first pixel electrode 311 is electrically connected to the first thin-film transistor 210 by contacting with any one of the first source electrode 215a and the first drain electrode 215b through a contact hole formed in the planarization layer 140 or the like. The first pixel electrode 311 includes a light-transmitting conductive layer formed of or including a light-transmitting conductive oxide such as ITO, In2O3, or IZO, and a reflective layer formed of or including a metal such as Al or Ag. For example, the first pixel electrode 311 may have a three-layer structure of ITO/Ag/ITO.

A second light-emitting device OLED2 having the second pixel electrode 321, the opposite electrode 305, and the intermediate layer 303 interposed therebetween and including the light-emitting layer may be located in the second pixel PX2. In addition, a third light-emitting device OLED3 having the third pixel electrode 331, the opposite electrode 305, and the intermediate layer 303 interposed therebetween and including the light-emitting layer may be located in the third pixel PX3. The second pixel electrode 321 is electrically connected to the second thin-film transistor 220 by contacting with any one of the second source electrode 225a and the second drain electrode 225b through a contact hole formed in the planarization layer 140 or the like. The third pixel electrode 331 is electrically connected to the third thin-film transistor 230 by contacting with any one of the third source electrode 235a and the third drain electrode 235b through a contact hole formed in the planarization layer 140 or the like. The above description of the first pixel electrode 311 may be applied to the second pixel electrode 321 and the third pixel electrode 331.

As described above, the intermediate layer 303 including the light-emitting layer may be located on the second pixel electrode 321 of the second pixel PX2 and the third pixel electrode 331 of the third pixel PX3 as well as the first pixel electrode 311 of the first pixel PX1. The intermediate layer 303 may have an integral shape over the first pixel electrode 311, the second pixel electrode 321, and the third pixel electrode 331. The intermediate layer 303 may be patterned and located on the first pixel electrode 311, the second pixel electrode 321, and the third pixel electrode 331. In addition to the light emitting layer, the intermediate layer 303 may also include a hole injection layer, a hole transport layer, and/or an electron transport layer, etc. Some of the layers included in the intermediate layer 303 may be integrally formed over the first pixel electrode 311 to the third pixel electrode 331, and other layers may be patterned and located on the first pixel electrode 311, the second pixel electrode 321, and the third pixel electrode 331.

The opposite electrode 305 on the intermediate layer 303 may also have an integral shape over the first pixel electrode 311 to the third pixel electrode 331. The opposite electrode 305 may include a light-transmitting conductive layer formed of or including ITO, In2O3, or IZO, and may also include a semi-transparent film including a metal such as Al, Li, Mg, Yb, or Ag. For example, the opposite electrode 305 may be a semi-transparent film including MgAg, AgYb, Yb/MgAg, or Li/MgAg.

The pixel-defining layer 150 may be arranged on the planarization layer 140. The pixel-defining layer 150 defines an opening corresponding to each pixel therein. That is, the pixel-defining layer 150 covers an edge of each of the first pixel electrode 311, the second pixel electrode 321, and the third pixel electrode 331 and defines an opening exposing a central portion of the first pixel electrode 311, an opening exposing a central portion of the second pixel electrode 321, and an opening exposing a central portion of the third pixel electrode 331. As such, the pixel-defining layer 150 may define a pixel. Because the first light-emitting device OLED1 includes the first pixel electrode 311, the pixel-defining layer 150 may define the first light-emitting device OLED1. The same applies to the second light-emitting device OLED2 and the third light-emitting device OLED3. That is, a light emitting area of the first light-emitting device OLED1, a light emitting area of the second light-emitting device OLED2, and a light emitting area of the third light-emitting device OLED3 are exposed through openings of a pixel-defining layer 150.

In addition, as shown in FIG. 2, the pixel-defining layer 150 may prevent generation of an arc on the edges of the first pixel electrode 311, the second pixel electrode 321, and the third pixel electrode 331 by increasing a distance between the opposite electrode 305 and each of the edges of the first pixel electrode 311, the second pixel electrode 321, and the third pixel electrode 331. The pixel-defining layer 150 may include an organic material such as polyimide or HMDSO.

Although not shown, a spacer may be arranged on the pixel-defining layer 150. The spacer may include an organic insulator such as polyimide, may include an inorganic insulating material such as silicon oxide, silicon nitride, and/or silicon oxynitride, or may include an organic insulating material and an inorganic insulating material. In addition, the spacer may include the same material as that of the pixel-defining layer 150. In this case, the pixel-defining layer 150 and the spacer may be formed together in a mask process using a half-tone mask or the like. The spacer and the pixel-defining layer 150 may include different materials.

The light emitting layer included in the intermediate layer 303 may emit light having a wavelength belonging to a first wavelength band. The first wavelength band may be, for example, 450 nanometers (nm) to 495 nm.

The upper substrate 400 is located on the lower substrate 100 so that the first pixel electrode 311, the second pixel electrode 321, and the third pixel electrode 331 are interposed between the upper substrate 400 and the lower substrate 100. The upper substrate 400 may include glass, metal, or a polymer resin. The upper substrate 400 may include, for example, a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. However, the upper substrate 400 may have a multilayer structure including two layers including the polymer resin, and a barrier layer including an inorganic material (such as silicon oxide, silicon nitride, silicon oxynitride, etc.) between the two layers, and various modifications thereof are possible. The upper substrate 400 may have flexible or bendable characteristics.

The bank 500 is located on a lower surface 400$b$ of the upper substrate 400 in a direction (−z direction) to the lower substrate 100. That is, the bank 500 is located between the upper substrate 400 and the lower substrate 100. The bank 500 defines a first opening 501, a second opening 502, and a third opening 503 therein.

The first opening 501 of the bank 500 corresponds to the first light-emitting device OLED1, the second opening 502 of the bank 500 corresponds to the second light-emitting device OLED2, and the third opening 503 of the bank 500 corresponds to the third light-emitting device OLED3. That is, when viewed from a direction (z-axis direction) perpendicular to an upper surface 400$a$ of the upper substrate 400 (i.e., plan view), the first opening 501 of the bank 500 overlaps the first light-emitting device OLED1, the second opening 502 of the bank 500 overlaps the second light-emitting device OLED2, and the third opening 503 of the bank 500 overlaps the third light-emitting device OLED3. Accordingly, when viewed from the direction (z-axis direction) perpendicular to the upper surface 400$a$ of the upper substrate 400, the shapes of edges of the first opening 501 to the third opening 503 of the bank 500 may be the same as or similar to the shapes of edges of the first light-emitting device OLED1 to the third light-emitting device OLED3, respectively. Accordingly, the first opening 501 of the bank 500 corresponds to the first pixel electrode 311, the second opening 502 of the bank 500 corresponds to the second pixel electrode 321, and the third opening 503 of the bank 500 corresponds to the third pixel electrode 331.

The bank 500 may be formed of or include various materials, and may be formed of an inorganic material such as silicon oxide, silicon nitride and/or silicon oxynitride. The bank 500 may include a photoresist material, through which the bank 500 may be easily formed through processes such as exposure and development.

A first resin layer 415 may be located in the first opening 501 of the bank 500, a second resin layer 425 may be located in the second opening 502 of the bank 500, and a third resin layer 435 may be located in the third opening 503 of the bank 500. When viewed from the direction (z-axis direction) perpendicular to the upper surfaces 400$a$ of the upper substrate 400, the first resin layer 415 may overlap the first light-emitting device OLED1, the second resin layer 425 may overlap the second light-emitting device OLED2, and the third resin layer 435 may overlap the third light-emitting device OLED3.

A color filter layer may be located between the lower surface 400$b$ of the upper substrate 400 and the first resin layer 415, the second resin layer 425, and the third resin layer 435. That is, a first color filter layer 410 may be between the upper substrate 400 and the first resin layer 415, a second color filter layer 420 may be between the upper substrate 400 and the second resin layer 425, and a third color filter layer 430 may be between the upper substrate 400 and the third resin layer 435. The first color filter layer 410 may be a layer that transmits only light having a wavelength of 630 nm to 780 nm. The second color filter layer 420 may be a layer that transmits only light having a wavelength of 495 nm to 570 nm. The third color filter layer 430 may be a layer that transmits only light having a wavelength of 450 nm to 495 nm.

The first color filter layer 410 to the third color filter layer 430 may increase the color purity of light emitted to the outside, thereby increasing the quality of a displayed image. In addition, the first color filter layer 410 to the third color filter layer 430 may reduce external light reflection by lowering a rate at which external light incident from the outside to the display apparatus 1 is reflected by the first pixel electrode 311 to the third pixel electrode 331 and then emitted to the outside again. A black matrix may be located between the first color filter layer 410 to the third color filter layer 430 as needed.

The second color filter layer 420 defines an opening 421 exposing a first portion P1 as shown in FIG. 2. The opening 421 may define an area of the first pixel PX1. The first color filter layer 410 fills at least the opening 421. In addition, the second color filter layer 420 defines an opening 423 exposing a third portion P3 as shown in FIG. 2. The opening 423 may define an area of the third pixel PX3. The third color filter layer 430 fills at least the opening 423. An end of the first color filter layer 410 in a direction to the second opening 502 and an end of the third color filter layer 430 in the direction to the second opening 502 define an opening 422 exposing a second portion P2. The opening 422 may define an area of the second pixel PX2.

A portion where the first color filter layer 410 and the second color filter layer 420 overlap, a portion where the third color filter layer 430 and the second color filter layer 420 overlap, and a portion where the first color filter layer 410 and the third color filter layer 430 overlap may serve as a black matrix. For example, if the first color filter layer 410 transmits only light having a wavelength of 630 nm to 780 nm and the second color filter layer 420 transmits only light having a wavelength of 495 nm to 570 nm, in a portion where the first color filter layer 410 and the second color filter layer 420 overlap, light that can pass through both the first color filter layer and the second color filter layer theoretically does not exist.

A filler may fill a space between the upper substrate 400 and the lower substrate 100. For example, in the case of the display apparatus 1 as shown in FIG. 2, a filler may fill a space between a protective layer 600 and the opposite electrode 305. Such a filler may include a light-transmissive material. For example, the filler may include an acrylic resin or an epoxy resin.

Figure 3:
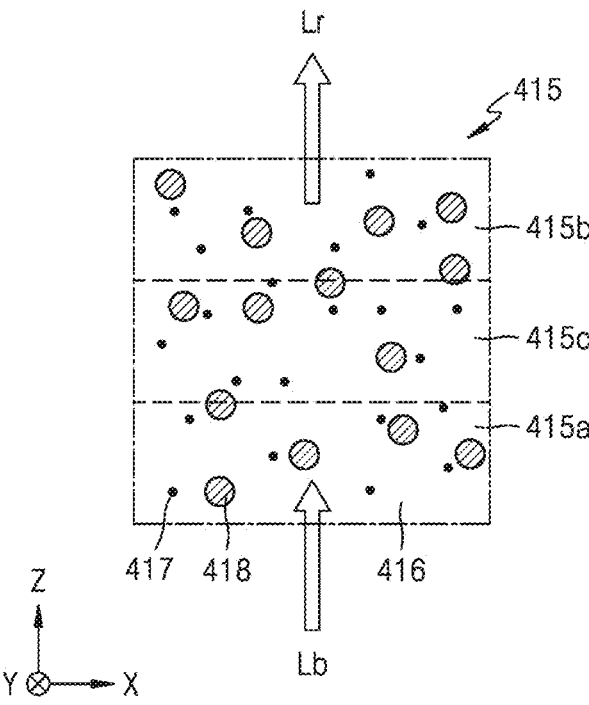
FIG. 3 is a cross-sectional view of a first resin layer of FIG. 2.

FIG. 3 is a cross-sectional view schematically illustrating the first resin layer 415 of FIG. 2. As shown in FIG. 3, the first resin layer 415 may include a first resin 416, a first scatterer 417, and a first quantum dot 418. The first resin layer 415 may include a first-first portion 415a located in a direction to the lower substrate 100, a first-second portion 415b located in a direction to the upper substrate 400, and a first-third portion 415c between the first-first portion 415a and the first-second portion 415b.

The first resin 416 may be any material that has excellent dispersion characteristics for scatterers and is transparent. For example, a polymer resin such as an acrylic resin, an imide resin, an epoxy resin, BCB, or HMDSO may be used as a material for forming the first resin layer 415, especially, the first resin 416. The material for forming the first resin layer 415 may be located in the first opening 501 of the bank 500 overlapping the first pixel electrode 311 through an inkjet printing method.

The first scatterer 417 may cause incident light incident on the first resin layer 415 to be scattered, and a wavelength of the scattered incident light may be converted by the first quantum dot 418 in the first resin layer 415. The first scatterer 417 is not particularly limited as long as it is a material capable of partially scattering transmitted light by forming an optical interface between the scatterer and a light-transmitting resin. For example, the first scatterer 417 may be metal oxide particles or organic particles. Examples of a metal oxide for scatterers may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like, and examples of an organic material for scatterers may include an acrylic resin and a urethane resin. The first scatterer 417 may scatter light in various directions regardless of an incident angle without substantially converting a wavelength of the incident light incident on the first resin layer 415. Through this, the first scatterer 417 may improve side visibility of the display apparatus 1. In addition, the first scatterer 417 may increase a light conversion efficiency by increasing the probability that the incident light incident on the first resin layer 415 meets the first quantum dot 418.

In a display apparatus according to an embodiment, the number of first scatterers 417 per unit volume in the first resin layer 415 may vary depending on the location in the first opening 501. For example, the number of first scatterers 417 per unit volume in the first resin layer 415 may decrease in the direction from the lower substrate 100 toward the upper substrate 400. In more detail, the number of first scatterers 417 per unit volume in the first-first portion 415a adjacent to the lower substrate 100 from among the lower substrate 100 and the upper substrate 400 may be greater than the number of first scatterers 417 per unit volume in the first-second portion 415b adjacent to the upper substrate 400 from among the lower substrate 100 and the upper substrate 400. In addition, the number of first scatterers 417 per unit volume in the first-third portion 415c between the first-first portion 415a and the first-second portion 415b may decrease in the direction from the lower substrate 100 toward the upper substrate 400.

When the number of first scatterers 417 per unit volume in the first resin layer 415 decreases in the direction from the lower substrate 100 to the upper substrate 400, a relatively large number of first scatterers 417 are located at a portion of the first resin layer 415 in a direction to the lower substrate 100. In this case, the incident light incident on the first resin layer 415 may be sufficiently scattered by the first scatterer 417 before the wavelength is converted by the first quantum dot 418. As the incident light is sufficiently scattered, the probability that the scattered light meets the first quantum dot 418 in the first resin layer 415 increases, so that the wavelength of the incident light incident on the first resin layer 415 may be efficiently converted.

For another example, the number of first scatterers 417 per unit volume in the first resin layer 415 may increase in the direction from the lower substrate 100 toward the upper substrate 400. In a display apparatus according to an embodiment, the number of first scatterers 417 per unit volume in the first-first portion 415a may be less than the number of first scatterers 417 per unit volume in the first-second portion 415b. In addition, the number of first scatterers 417 per unit volume in the first-third portion 415c may increase in the direction from the lower substrate 100 toward the upper substrate 400.

When the number of first scatterers 417 per unit volume in the first resin layer 415 increases in the direction from the lower substrate 100 toward the upper substrate 400, a relatively large number of first scatterers 417 are located at the portion of the first resin layer 415 in a direction to the upper substrate 400. In this case, because the incident light is scattered by the first scatterer 417 immediately before being emitted from the first resin layer 415 after the wavelength is converted by the first quantum dot 418, a large amount of light may also travel in a lateral direction of the display apparatus 1. Accordingly, side visibility of the display apparatus 1 may be effectively improved.

The first quantum dot 418 may convert light having a wavelength belonging to a first wavelength band passing through the first resin layer 415 into light having a wavelength belonging to a second wavelength band. For example, the first wavelength band may be, for example, 450 nm to 495 nm, and the second wavelength band may be 630 nm to 780 nm. That is, the first quantum dot 418 may convert the incident blue light Lb into the red light Lr. However, the disclosure is not limited thereto. In another embodiment, a wavelength band to which a wavelength to be converted by the first resin layer 415 belongs and a wavelength band to which a wavelength after conversion belongs may be different. Specific details of the first quantum dot 418 will be described later below.

In a display apparatus according to an embodiment, the number of first quantum dots 418 per unit volume in the first resin layer 415 may vary depending on the location in the first opening 501. For example, the number of first quantum dots 418 per unit volume in the first resin layer 415 may increase in a direction from the lower substrate 100 toward the upper substrate 400. In a display apparatus according to an embodiment, the number of first quantum dots 418 per unit volume in the first-first portion 415a may be less than the number of first quantum dots 418 per unit volume in the first-second portion 415b. In addition, the number of first quantum dots 418 per unit volume in the first-third parts 415c may increase in the direction from the lower substrate 100 toward the upper substrate 400.

When the number of first quantum dots 418 per unit volume in the first resin layer 415 increases in the direction from the lower substrate 100 toward the upper substrate 400, a relatively large number of first quantum dots 418 are located at a portion of the first resin layer 415 in a direction to the upper substrate 400. In addition, a relatively large number of first scatterers 417 are located at a portion of the first resin layer 415 in a direction to the lower substrate 100. In this case, after the incident light incident on the first resin layer 415 is sufficiently scattered by the first scatterer 417, the wavelength may be converted by the first quantum dot 418. As the incident light is sufficiently scattered, the probability that the scattered light meets the first quantum dot 418 in the first resin layer 415 increases, so that the wavelength of the incident light incident on the first resin layer 415 may be efficiently converted.

For another example, the number of first quantum dots 418 per unit volume in the first resin layer 415 may decrease in the direction from the lower substrate 100 toward the upper substrate 400. In a display apparatus according to an embodiment, the number of first quantum dots 418 per unit volume in the first-first portion 415a may be greater than the number of first quantum dots 418 per unit volume in the first-second portion 415b. In addition, the number of first quantum dots 418 per unit volume in the first-third parts 415c may decrease in the direction from the lower substrate 100 toward the upper substrate 400.

When the number of first quantum dots 418 per unit volume in the first resin layer 415 decreases in the direction from the lower substrate 100 toward the upper substrate 400, a relatively large number of first quantum dots 418 are located at a portion of the first resin layer 415 in the direction to the lower substrate 100. In addition, a relatively large number of first scatterers 417 are located at a portion of the first resin layer 415 in the direction to the upper substrate 400. In this case, because the incident light is scattered by the first scatterer 417 immediately before being emitted from the first resin layer 415 after the wavelength is converted by the first quantum dot 418, a large amount of light may also travel in the lateral direction of the display apparatus 1. Accordingly, side visibility of the display apparatus 1 may be effectively improved.

Figure 4:
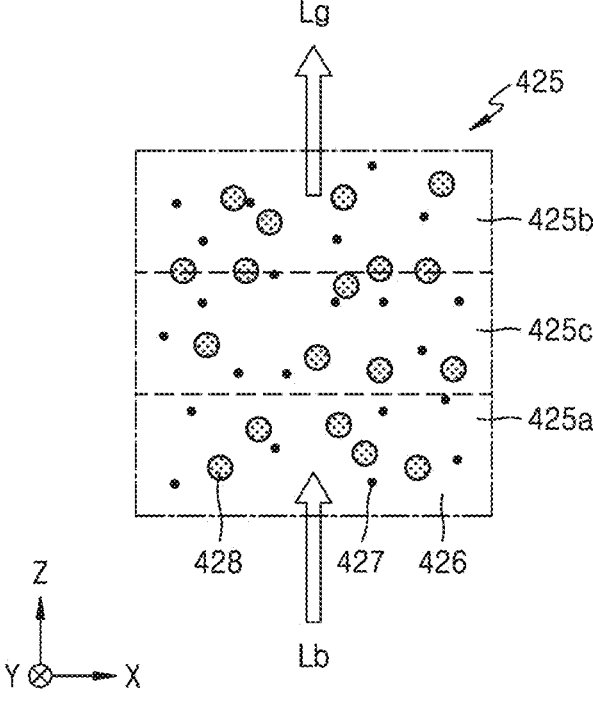
FIG. 4 is a cross-sectional view of a second resin layer of FIG. 2.

FIG. 4 is a cross-sectional view schematically illustrating the second resin layer 425 of FIG. 2. As shown in FIG. 4, the second resin layer 425 may include a second resin 426, a second scatterer 427, and a second quantum dot 428. The second resin layer 425 may include a second-first portion 425a located in a direction to the lower substrate 100, a second-second portion 425b located in a direction to the upper substrate 400, and a second-third portion 425c between the second-first portion 425a and the second-second portion 425b.

The second resin 426 may be any material that has excellent dispersion characteristics for scatterers and is transparent. For example, a polymer resin such as an acrylic resin, an imide resin, an epoxy resin, BCB, or HMDSO may be used as a material for forming the second resin layer 425. The material for forming the second resin layer 425 may be located in the second opening 502 of the bank 500 overlapping the second light-emitting device OLED2 through an inkjet printing method.

The second scatterer 427 may cause incident light incident on the second resin layer 425 to be scattered, and a wavelength of the scattered incident light may be converted by the second quantum dot 428 in the second resin layer 425. The second scatterer 427 is not particularly limited as long as it is a material capable of partially scattering transmitted light by forming an optical interface between a scatterer and a light-transmitting resin, but may be, for example, metal oxide particles or organic particles. A metal oxide for scatterers and an organic material for scatterers are the same as described above. The second scatterer 427 may scatter light in various directions regardless of an incident angle without substantially converting a wavelength of the incident light incident on the second resin layer 425. Through this, the second scatterer 427 may improve side visibility of the display apparatus 1. In addition, the second scatterer 427 may increase a light conversion efficiency by increasing the probability that the incident light incident on the second resin layer 425 meets the second quantum dot 428.

In a display apparatus according to an embodiment, the number of second scatterers 427 per unit volume in the second resin layer 425 may vary depending on the location in the second opening 502. For example, the number of second scatterers 427 per unit volume in the second resin layer 425 may decrease in a direction from the lower substrate 100 toward the upper substrate 400. In more detail, the number of second scatterers 427 per unit volume in the second-first portion 425a adjacent to the lower substrate 100 from among the lower substrate 100 and the upper substrate 400 may be greater than the number of second scatterers 427 per unit volume in the second-second portion 425b adjacent to the upper substrate 400 from among the lower substrate 100 and the upper substrate 400. In addition, the number of second scatterers 427 per unit volume in the second-third portion 425c between the second-first portion 425a and the second-second portion 425b may decrease in a direction from the lower substrate 100 toward the upper substrate 400.

When the number of second scatterers 427 per unit volume in the second resin layer 425 decreases in a direction from the lower substrate 100 toward the upper substrate 400, a relatively large number of second scatterers 427 are located at a portion of the second resin layer 425 in a direction to the lower substrate 100. The incident light incident on the second resin layer 425 may be sufficiently scattered by the second scatterer 427 before the wavelength is converted by the second quantum dot 428. As the incident light is sufficiently scattered, the probability that the scattered light meets the second quantum dot 428 in the second resin layer 425 increases, so that the wavelength of the incident light incident on the second resin layer 425 may be efficiently converted.

For example, the number of second scatterers 427 per unit volume in the second resin layer 425 may increase in a direction from the lower substrate 100 toward the upper substrate 400. In a display apparatus according to an embodiment, the number of second scatterers 427 per unit volume in the second-first portion 425a may be less than the number of second scatterers 427 per unit volume in the second-second portion 425b. In addition, the number of second scatterers 427 per unit volume in the second-third parts 425c may increase in a direction from the lower substrate 100 toward the upper substrate 400.

When the number of second scatterers 427 per unit volume in the second resin layer 425 increases in a direction from the lower substrate 100 toward the upper substrate 400, a relatively large number of second scatterers 427 are located at a portion of the second resin layer 425 in a direction of the upper substrate 400. Because the incident light is scattered by the second scatterer 427 immediately before being emitted from the second resin layer 425 after the wavelength is converted by the second quantum dot 428, a large amount of light may also travel in the lateral direction of the display apparatus 1. Accordingly, side visibility of the display apparatus 1 may be effectively improved.

The second quantum dot 428 may convert light having a wavelength belonging to a first wavelength band passing through the second resin layer 425 into light having a wavelength belonging to a third wavelength band. For example, the first wavelength band may be, for example, 450 nm to 495 nm, and the third wavelength band may be 495 nm to 570 nm. That is, the second quantum dot 428 may convert the incident blue light Lb into the green light Lg. However, the disclosure is not limited thereto. In another embodiment, a wavelength band to which a wavelength to be converted by the second resin layer 425 belongs and a wavelength band to which a wavelength after conversion belongs may be different.

In a display apparatus according to an embodiment, the number of second quantum dots 428 per unit volume in the second resin layer 425 may vary depending on the location in the second opening 502. For example, the number of second quantum dots 428 per unit volume in the second resin layer 425 may increase in a direction from the lower substrate 100 toward the upper substrate 400. In a display apparatus according to an embodiment, the number of second quantum dots 428 per unit volume in the second-first portion 425a may be less than the number of second quantum dots 428 per unit volume in the second-second portion 425b. In addition, the number of second quantum dots 428 per unit volume in the second-third parts 425c may increase in a direction from the lower substrate 100 toward the upper substrate 400.

When the number of second quantum dots 428 per unit volume in the second resin layer 425 increases in a direction from the lower substrate 100 toward the upper substrate 400, a relatively large number of second quantum dots 428 are located at a portion of the second resin layer 425 in a direction to the upper substrate 400. In addition, a relatively large number of second scatterers 427 are located at a portion of the second resin layer 425 in a direction to the lower substrate 100. After the incident light incident on the second resin layer 425 is sufficiently scattered by the second scatterer 427, the wavelength may be converted by the second quantum dot 428. As the incident light is sufficiently scattered, the probability that the scattered light meets the second quantum dot 428 in the second resin layer 425 increases, so that the wavelength of the incident light incident on the second resin layer 425 may be efficiently converted.

For example, the number of second quantum dots 428 per unit volume in the second resin layer 425 may decrease in a direction from the lower substrate 100 toward the upper substrate 400. In a display apparatus according to an embodiment, the number of second quantum dots 428 per unit volume in the second-first portion 425a may be greater than the number of second quantum dots 428 per unit volume in the second-second portion 425b. In addition, the number of second quantum dots 428 per unit volume in the second-third parts 425c may decrease in a direction from the lower substrate 100 toward the upper substrate 400.

When the number of second quantum dots 428 per unit volume in the second resin layer 425 decreases in a direction from the lower substrate 100 toward the upper substrate 400, a relatively large number of second quantum dots 428 are located at a portion of the second resin layer 425 in a direction to the lower substrate 100. In addition, a relatively large number of second scatterers 427 are located at a portion of the second resin layer 425 in a direction to the upper substrate 400. Because the incident light is scattered by the second scatterer 427 immediately before being emitted from the second resin layer 425 after the wavelength is converted by the second quantum dot 428, a large amount of light may also travel in the lateral direction of the display apparatus 1. Accordingly, side visibility of the display apparatus 1 may be effectively improved.

The above-described first quantum dot 418 and second quantum dot 428 refer to crystals of a semiconductor compound, and may include any material capable of emitting light in various wavelength bands according to the size of the crystals. The diameters of the first quantum dot 418 and the second quantum dot 428 may be, for example, approximately 1 nm to 10 nm. Hereinafter, quantum dots that may be included in the first quantum dot 418 and the second quantum dot 428 will be described.

The quantum dots may be synthesized by a wet chemical process, a metal organic chemical vapor deposition process, a molecular beam epitaxy process, or a similar process. The wet chemical process is a method of growing quantum dot particle crystals after mixing an organic solvent and a precursor material. In the wet chemical process, when the quantum dot particle crystals grow, the organic solvent naturally acts as a dispersant coordinated on a surface of the quantum dot particle crystals and controls the growth of the crystals. Therefore, the wet chemical process is easier than a vapor deposition method such as metal organic chemical vapor deposition ("MOCVD") or molecular beam epitaxy ("MBE"). In addition, the wet chemical process may control the growth of quantum dot particles at low cost.

Such quantum dots may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of the Group II-VI semiconductor compound may include a binary compound such as CdS, CdSe, CdTe, ZnS, ZnSe, ZnTe, ZnO, HgS, HgSe, HgTe, MgSe, MgS, or the like, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or the like, a quaternary compound such as CdZnSeS, CdZnSeTe, CdZn-STe, CdHgSeS, CdHgSeTe, CdHgSTe, HgZnSeS, HgZn-SeTe, HgZnSTe, or the like, or any combination thereof.

Examples of the Group III-V semiconductor compound may include a binary compound such as GaN, GaP, GaAs, GaSb, AlN, AlP, AlAs, AlSb, InN, InP, InAs, InSb, or the like, a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, or the like, a quaternary compound such as GaAlNAs, GaAlNSb, GaAlPAs, GaAlPSb, GaInNP, GaInNAs, Gal-nNSb, GaInPAs, GaInPSb, InAlNP, InAlNAs, InAlNSb, InAlPAs, InAlPSb, or the like, or any combination thereof. However, a Group III-V semiconductor compound may further include a Group II element. Examples of the Group III-V semiconductor compound further including the Group II element may include InZnP, InGaZnP, InAlZnP, or the like.

Examples of the Group III-VI semiconductor compound may include a binary compound such as GaS, GaSe, $Ga_2Se_3$, GaTe, InS, InSe, $In_2Se_3$, InTe, or the like, a ternary compound such as AgInS, $AgInS_2$, CuInS, $CuInS_2$, $InGaS_3$, $InGaSe_3$, or the like, or any combination thereof.

Examples of the Group I-III-VI semiconductor compound may include a ternary compound such as AgInS, $AgInS_2$, CuInS, $CuInS_2$, $CuGaO_2$, $AgGaO_2$, $AgAlO_2$, or the like, or any combination thereof.

Examples of the Group IV-VI semiconductor compound may include a binary compound such as SnS, SnSe, SnTe, PbS, PbSe, PbTe, or the like, a ternary compound such as SnSeS, SnSeTe, SnSTe, PbSeS, PbSeTe, PbSTe, SnPbS, SnPbSe, SnPbTe, or the like, a quaternary compound such as SnPbSSe, SnPbSeTe, SnPbSTe, or the like, or any combination thereof.

The Group IV element or compound may include a single compound such as Si or Ge, a binary compound such as SiC and SiGe, or any combination thereof.

Each of elements included in a multi-element compound such as a binary compound, a ternary compound, and a ternary compound may be in a particle in a uniform concentration or in a non-uniform concentration.

However, quantum dots may have a single structure or a core-shell dual structure in which concentrations of elements respectively included in corresponding quantum dots are uniform. For example, a material included in the core and a material included in the shell may be different from each other. The shell of the quantum dots may serve as a protective layer for maintaining semiconductor properties by preventing chemical modification of the core and/or as a charging layer for imparting electrophoretic properties to the quantum dots. The shell may be a single layer or multiple layers. An interface between the core and the shell may have a concentration gradient in which the concentration of an element present in the shell decreases toward the center.

Examples of the shell of the quantum dots may include a metal or non-metal oxide, a semiconductor compound, or a combination thereof. Examples of the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or the like, a ternary compound such as $MgAl_2O_4$, $CoFe_2O_4$, $NiFe_2O_4$, $CoMn_2O_4$, or the like, or any combination thereof. Examples of the semiconductor compound may include, as described above, the Group III-VI semiconductor compound, the Group II-VI semiconductor compound, the Group III-V semiconductor compound, the Group III-VI semiconductor compound, the Group I-III-VI semiconductor compound, the Group IV-VI semiconductor compound, or any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dots may have a full width of half maximum ("FWHM") of an emission wavelength spectrum of about 45 nm or less, specifically about 40 nm or less, and more specifically about 30 nm or less, and in this range, color purity and color reproducibility may be improved. In addition, because light emitted through the quantum dots is emitted in all directions, a wide viewing angle may be improved.

In addition, the shape of the quantum dots may be specifically spherical, pyramidal, multi-arm, or cubic nanoparticles, nanotubes, nanowires, nanofibers, nanoplatelet particles, or the like.

An energy band gap may be controlled by adjusting the size of the quantum dots, and thus light in various wavelength bands may be obtained from a quantum dot light-emitting layer. Accordingly, by using quantum dots of different sizes, a light emitting device that emits light of different wavelengths may be implement. In more detail, sizes of the quantum dots may be selected such that red, green and/or blue light is emitted. In addition, sizes of the quantum dots may be configured such that light of various colors is combined to emit white light.

The description of such quantum dots may be applied to embodiments and modifications thereof to be described later as well as the above-described embodiments and modifications thereof.

Figure 5:
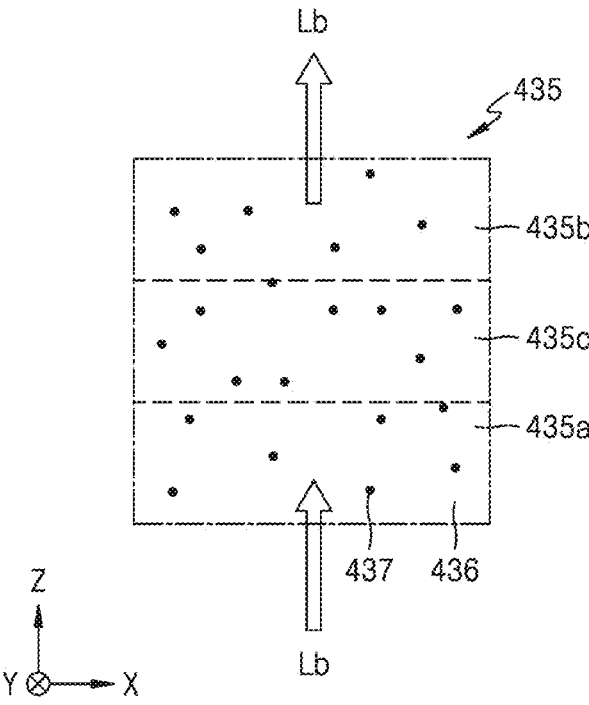
FIG. 5 is a cross-sectional view of a third resin layer of FIG. 2.

FIG. 5 is a cross-sectional view schematically illustrating the third resin layer 435 of FIG. 2. As shown in FIG. 5, the third resin layer 435 may include a third resin 436 and a third scatterer 437 and does not have quantum dots. The third resin layer 435 may include a third-1 portion 435a located in a direction to the lower substrate 100, the third-2 portion 435b located in a direction to the upper substrate 400, and a third-3 portion 435c between the third-1 portion 435a and the third-2 portion 435b.

The third resin 436 may be any material that has excellent dispersion characteristics for scatterers and is transparent. For example, a polymer resin such as an acrylic resin, an imide resin, an epoxy resin, BCB, or HMDSO may be used as a material for forming the third resin layer 435, specifically the third resin 436. The third scatterer 437 may cause incident light incident on the third resin layer 435 to be scattered, and the third scatterer 437 is not particularly limited as long as it is a material capable of partially scattering transmitted light by forming an optical interface between a scatterer and a light-transmitting resin, but may be, for example, metal oxide particles or organic particles. A metal oxide for scatterers and an organic material for scatterers are the same as described above.

Because the third resin layer 435 does not have quantum dots, the third pixel PX3 emits light of a wavelength belonging to the first wavelength band generated by the intermediate layer 303 including a light-emitting layer to the outside through the upper substrate 400 without wavelength conversion. That is, the blue light Lb incident on the third resin layer 435 is emitted to the outside without wavelength conversion. In some cases, the third resin layer 435 may not exist in the third opening 503 of the bank 500 unlike that shown in FIG. 2.

In a display apparatus according to an embodiment, the number of third scatterers 437 per unit volume in the third resin layer 435 may be constant. For example, the number of third scatterers 437 per unit volume in the third-1 portion 435a adjacent to the lower substrate 100 from among the lower substrate 100 and the upper substrate 400, the number of third scatterers 437 per unit volume in the third-2 portion 435b adjacent to the upper substrate 400 from among the lower substrate 100 and the upper substrate 400, and the number of third scatterers 437 per unit volume in the third-3 portion 435c between the 3-1 portion 435a and the 3-2 portion 435b may be the same or similar.

In a display apparatus according to an embodiment, the first scatterer 417, the second scatterer 427, and the third scatterer 437 may include the same material. For example, the first scatterer 417, the second scatterer 427, and the third scatterer 437 may include titanium oxide ($TiO_2$).

Figure 6:
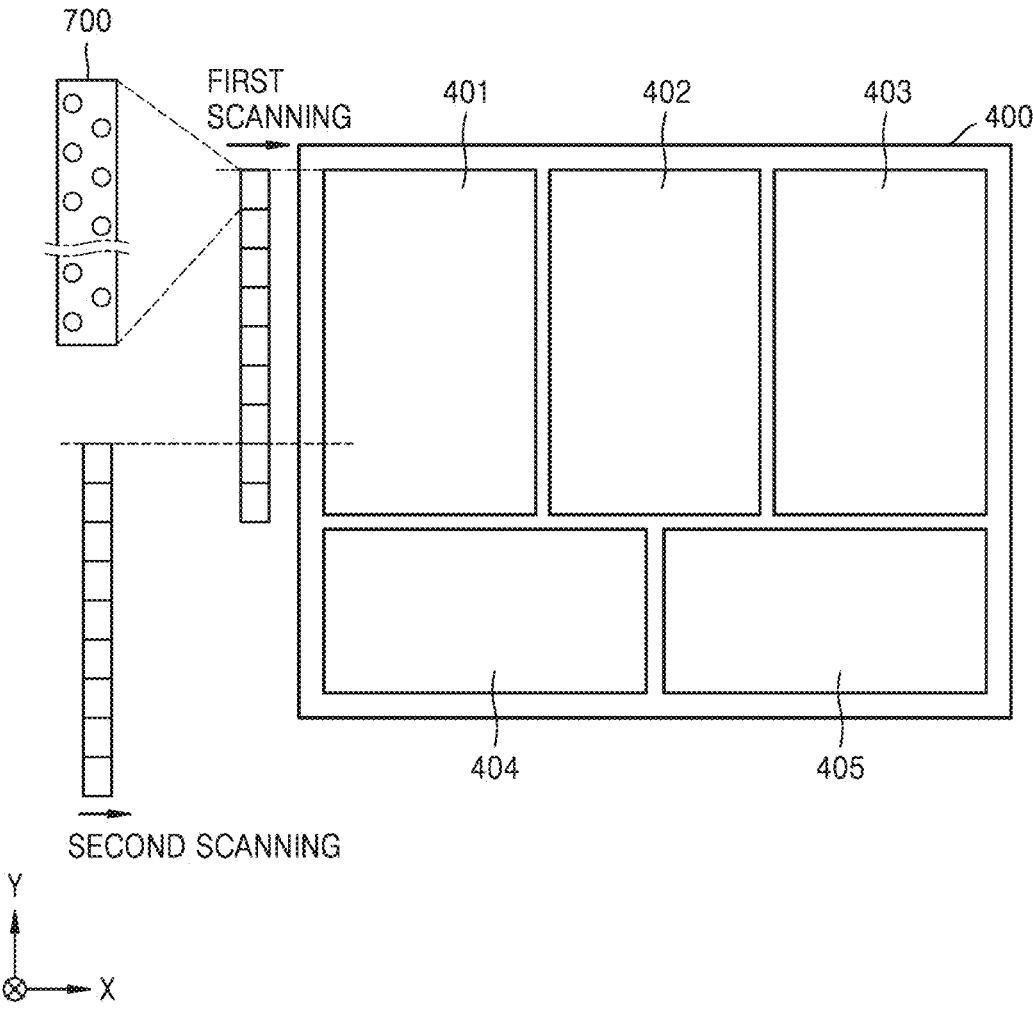
FIG. 6 is a plan view illustrating a method of manufacturing a display apparatus according to an embodiment.
Figure 7:
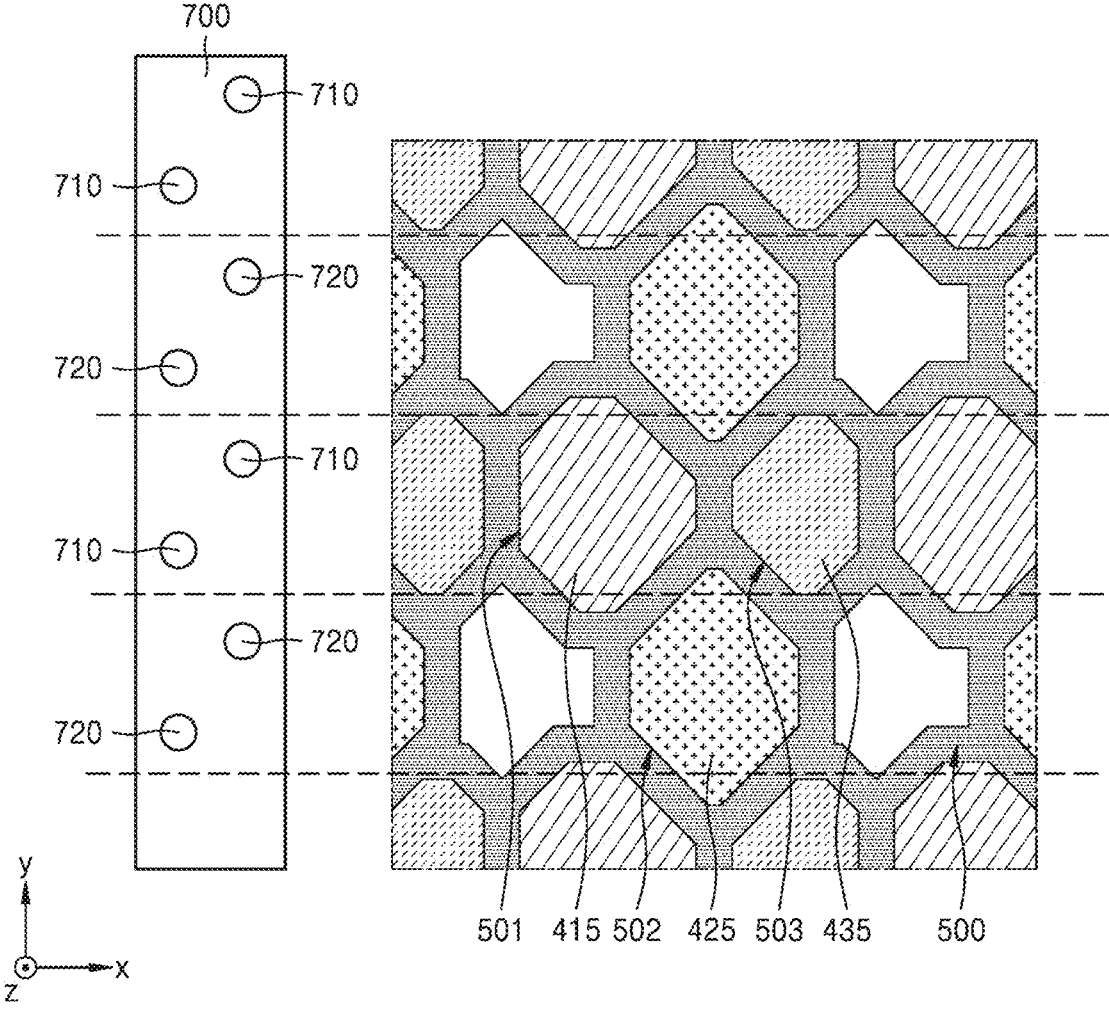
FIG. 7 is a plan view illustrating a method of manufacturing a display apparatus according to an embodiment.

FIGS. 6 and 7 are plan views schematically illustrating a method of manufacturing a display apparatus according to an embodiment, in more detail, plan views schematically illustrating a process of forming the first resin layer 415, the second resin layer 425, and the third resin layer 435 on the upper substrate 400.

Referring to FIGS. 6 and 7, the first resin layer 415, the second resin layer 425, and the third resin layer 435 of the display apparatus according to an embodiment may be formed by an inkjet printing method. That is, after the bank 500 defining the first opening 501, the second opening 502, and the third opening 503 is formed on the upper substrate 400, the first resin layer 415, the second resin layer 425, and the third resin layer 435 may be formed by dotting a material for forming the first resin layer 415 including at least one of the first scatterer 417 and the first quantum dot 418 in the first opening 501 by an inkjet printing method, by dotting a material for forming the second resin layer 425 including at least one of the second scatterer 427 and the second quantum dot 428 in the second opening 502 by an inkjet printing method, and by dotting a material for forming the third resin layer 435 including the third scatterer 437.

A discharge unit 700 may discharge droplets to the upper substrate 400. The upper substrate 400 may include a first upper substrate area 401, a second upper substrate area 402, a third upper substrate area 403, a fourth upper substrate area 404, and a fifth upper substrate area 405. A plurality of display panels may be simultaneously manufactured by combining the upper substrate 400 with a mother substrate on which a plurality of display units is formed and then cutting the mother substrate and the upper substrate 400 at the same time. A droplet may include quantum dots or scatterers.

There may be a plurality of discharge units 700, and there may be a plurality of droplets discharged to the upper substrate 400. When a plurality of droplets including different components are discharged to the upper substrate 400, each droplet may be discharged to the upper substrate 400 by different discharge units 700. In addition, each discharge unit 700 may include a plurality of nozzles. For example, the discharge unit 700 may include a first nozzle 710 and a second nozzle 720.

Any one of the discharge unit 700 and the upper substrate 400 may move in the first direction (x-axis direction). Accordingly, the discharge unit 700 may discharge a droplet to a desired location while performing first scanning of the upper substrate 400. After the discharge unit 700 performs the first scanning of the upper substrate 400, any one of the discharge unit 700 and the upper substrate 400 may move in a second direction (−y direction) intersecting the first direction (x-axis direction). After moving in the second direction (−y direction), any one of the discharge unit 700 and the upper substrate 400 may move in the first direction (x-axis direction). Accordingly, the discharge unit 700 may discharge a droplet at a desired location while performing second scanning of the upper substrate 400.

As shown in FIG. 7, as any one of the discharge unit 700 and the upper substrate 400 moves in the first direction (x-axis direction), the discharge unit 700 may discharge a first droplet into the first opening 501. First nozzles 710 discharge the first droplet because the first nozzles 710 of the discharge unit 700 pass over the first openings 501, and second nozzles 720 do not discharge the first droplet because the second nozzles 720 of the discharge unit 700 do not pass over the first openings 501.

When any one of the discharge unit 700 and the upper substrate 400 moves in the second direction (−y direction) intersecting the first direction (x-axis direction) and then moves again in the first direction (x-axis direction), the second nozzles 720 may pass over the first openings 501 and the first nozzles 710 may not pass over the first openings 501. In this case, the second nozzles 720 may discharge the first droplet, and the first nozzles 710 may not discharge the first droplet. That is, a nozzle (e.g., 710) for discharging the first droplet during the first scanning and a nozzle (e.g., 720) for discharging the first droplet during the second scanning may be different from each other.

When the first droplet includes scatterers, the second nozzle 720 does not discharge the first droplet during the first scanning, and thus, the scatterers included in the first droplet may be deposited inside the second nozzles 720. Accordingly, the number of scatterers included in the first droplet discharged from the second nozzle 720 during the second scanning may be different from the number of scatterers included in the first droplet discharged from the first nozzle 710 during the first scanning. As a result, because the concentration of scatterers in some pixels of the display apparatus 1 and the concentration of scatterers in some other pixels are different from each other, a stain may be generated in an image displayed by the display apparatus 1.

Figure 8:
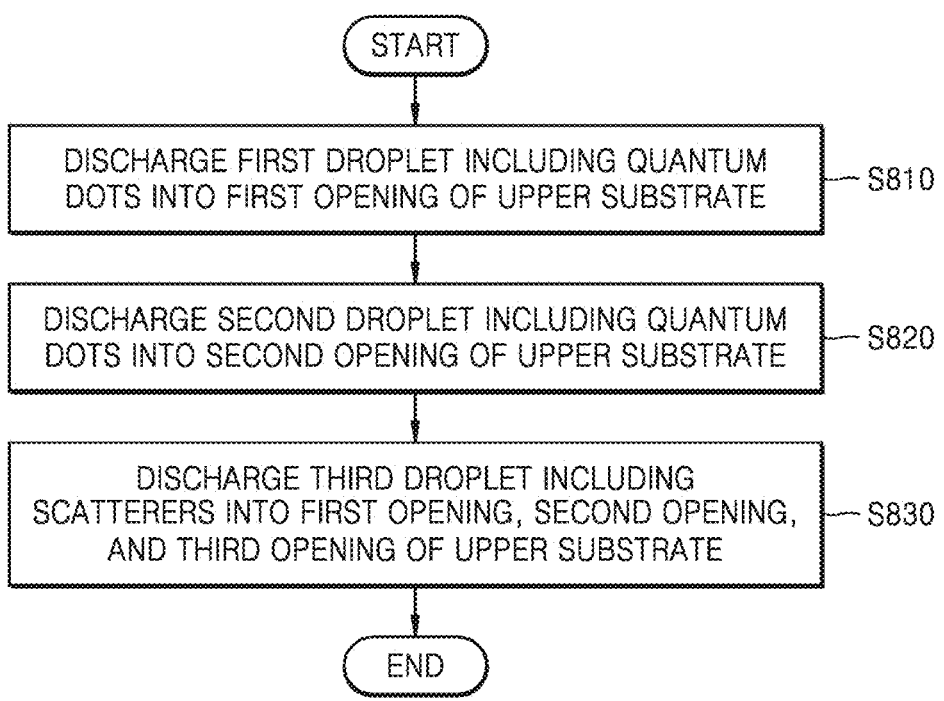
FIG. 8 is a flowchart illustrating a method of manufacturing a display apparatus according to an embodiment.

FIGS. 8 to 11 are flowcharts illustrating a method of manufacturing a display apparatus according to an embodiment. Referring to FIGS. 8 to 11, the method of manufacturing a display apparatus includes time-series processing in the discharge unit 700 illustrated in FIGS. 6 and 7. According to the method of manufacturing a display apparatus, the display apparatus 1 as described above with reference to FIGS. 1 to 5 may be manufactured. Hereinafter, for convenience, contents overlapping with those described above with reference to FIGS. 1 to 7 will not be given herein. FIG. 8 is a flowchart illustrating a method of manufacturing a display apparatus according to an embodiment.

In operation 810, the discharge unit 700 may discharge a first droplet including quantum dots into the first opening 501 of the upper substrate 400. In the method of manufacturing a display apparatus according to an embodiment, the first droplet may not include scatterers. For example, the first droplet may include the first quantum dot 418 and may not include the first scatterer 417.

If the first droplet includes scatterers and the second nozzle 720 does not pass over the first openings 501 and thus the first droplet is not discharged for a long time, precipitation of the scatterer included in the first droplet may occur inside the second nozzles 720. Thereafter, when any one of the discharge unit 700 and the upper substrate 400 moves in the second direction (−y direction) and then moves in the first direction (x-axis direction), and the second nozzle 720 passes over the first openings 501, the second nozzle 720 may discharge the first droplet. In this case, the concentration of the scatterer in the first droplet discharged from the second nozzle 720 may be greater than the concentration of the scatterer in the first droplet discharged from the first nozzle 710. As a result, because the concentration of scatterers in some pixels of the display apparatus 1 and the concentration of scatterers in some other pixels are different from each other, a stain may be generated in an image displayed by the display apparatus 1.

However, in the case of the method of manufacturing a display apparatus according to the present embodiment, the first droplet does not include scatterers as described above. Accordingly, even if the second nozzle 720 of the discharge unit 700 does not pass over the first openings 501 and thus the first droplet is not discharged for a long time, precipitation of the scatterer does not occur inside the second nozzle 720, so that it is possible to effectively prevent the concentration of the scatterer from being changed in different regions of the display apparatus 1.

In operation 820, the discharge unit 700 may discharge a second droplet including quantum dots into the second opening 502 of the upper substrate 400. In the method of manufacturing a display apparatus according to an embodiment, the second droplet may not include scatterers. For example, the second droplet may include the second quantum dot 428 and may not include the second scatterer 427.

If the second droplet includes scatterers and the first nozzle 710 of the discharge unit 700 does not pass over the second openings 502 and thus the second droplet is not discharged for a long time, precipitation of the scatterer included in the second droplet may occur inside the second nozzles 720. Thereafter, when any one of the discharge unit 700 and the upper substrate 400 moves in the second direction intersecting the first direction, the first nozzle 710 of the discharge unit 700 may pass over the second openings 502. In this case, the first nozzle 710 discharges the second droplet, and the second droplet discharged by the first nozzle 710 includes a high concentration of scatterers, so that a stain of the second droplet may be generated in a pixel.

In other words, if the second droplet includes scatterers and the first nozzle 710 does not pass over the second openings 502 and thus the second droplet is not discharged for a long time, precipitation of the scatterer included in the second droplet may occur inside the first nozzles 710. Thereafter, when any one of the discharge unit 700 and the upper substrate 400 moves in the second direction (−y direction) and then moves in the first direction (x-axis direction), and the first nozzle 710 passes over the second openings 502, the first nozzle 710 may discharge the second droplet. In this case, the concentration of the scatterer in the second droplet discharged from the first nozzle 710 may be greater than the concentration of the scatterer in the second droplet discharged from the second nozzle 720. As a result, because the concentration of scatterers in some pixels of the display apparatus 1 and the concentration of scatterers in some other pixels are different from each other, a stain may be generated in an image displayed by the display apparatus 1.

However, in the case of the method of manufacturing a display apparatus according to the present embodiment, the second droplet does not include scatterers as described above. Accordingly, even if the first nozzle 710 of the discharge unit 700 does not pass over the second openings 502 and thus the second droplet is not discharged for a long time, precipitation of the scatterer does not occur inside the first nozzle 710, so that it is possible to effectively prevent the concentration of the scatterer from being changed in different areas of the display apparatus 1.

In operation 830, the discharge unit 700 may discharge a third droplet including scatterers into the first opening 501, the second opening 502, and the third opening 503 of the upper substrate 400. For example, the third droplet may include the third scatterer 437.

When the discharge unit 700 discharges the third droplet into the first opening 501, the second opening 502, and the third opening 503, both the first nozzles 710 and the second nozzles 720 discharge the third droplet. There is no nozzle that does not discharge the third droplet for a long time. Therefore, in the case of the method of manufacturing a display apparatus according to the present embodiment, even if the third droplet includes scatterers, precipitation of the scatterers does not occur inside the first nozzle 710 or the second nozzle 720. Even if precipitation of the scatterers occurs inside the first nozzle 710 or the second nozzle 720, there is no difference between the degree of precipitation which occurs inside the first nozzle 710 and the degree of precipitation which occurs inside the second nozzle 720. In this case, the concentration of scatterers in the third droplet discharged from the first nozzle 710 is the same as or similar to the concentration of scatterers in the third droplet discharged from the second nozzle 720. As a result, because the concentrations of scatterers in all pixels of the display apparatus 1 are the same or similar, a stain is not generated in an image displayed by the display apparatus 1.

In the method of manufacturing a display apparatus according to an embodiment, different amounts of third droplets may be discharged into the first opening 501, the second opening 502, and the third opening 503, respectively. It is optically advantageous that the first resin layer 415, the second resin layer 425, and the third resin layer 435 generated by the first droplet, the second droplet, and the third droplet, respectively, have the same or similar thickness. Accordingly, in order to form the first resin layer 415, the second resin layer 425, and the third resin layer 435 having the same or similar thickness, the amounts of the third droplets discharged into the first opening 501, the second opening 502, and the third opening 503, respective, may be different from each other. For example, because the first droplet and the second droplet are discharged into the first opening 501 and the second opening 502, respectively, before the third droplet is discharged, a smaller amount of third droplets than the amount of third droplets discharged into the third opening 503 may be discharged into the first opening 501 and the second opening 502, respectively. That is, an amount of third droplets greater than the amount of third droplets respectively discharged to the first and second openings 501 and 502, respectively, may be discharged into the third opening 503.

FIG. 9 is a flowchart illustrating a method of manufacturing a display apparatus according to an embodiment. In more detail, FIG. 9 is a flowchart illustrating discharging a first droplet.

In operation 910, as any one of the discharge unit 700 and the upper substrate 400 is moved in the first direction, the first droplet may be discharged from the discharge unit 700 into the first opening 501 of a first area of the upper substrate 400. In the method of manufacturing a display apparatus according to an embodiment, the first droplet may be discharged from the first nozzle 710 of the discharge unit 700 into the first opening 501 of the first area of the upper substrate 400.

In operation 920, any one of the discharge unit 700 and the upper substrate 400 may be moved in the second direction (−y direction) intersecting the first direction (x-axis direction).

In operation 930, as any one of the discharge unit 700 and the upper substrate 400 is moved in the first direction (x-axis direction), the first droplet may be discharged from the discharge unit 700 into the first opening 501 of a second area of the upper substrate 400. In the method of manufacturing a display apparatus according to an embodiment, the first droplet may be discharged from the second nozzle 720 of the discharge unit 700 into the first opening 501 of the second area of the upper substrate 400.

Figure 10:
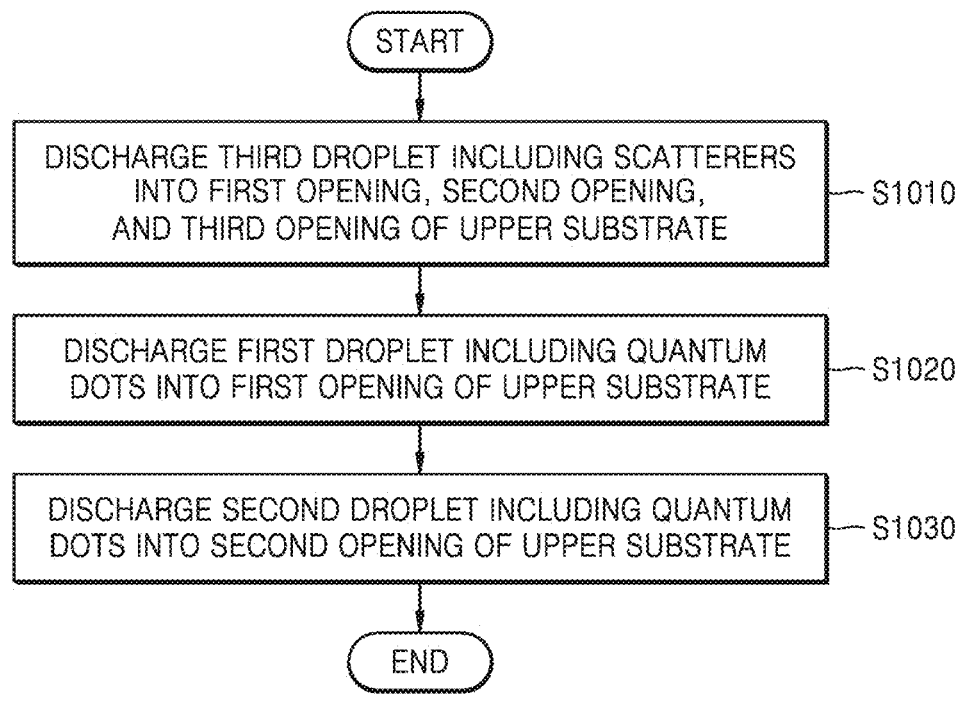
FIG. 10 is a flowchart illustrating a method of manufacturing a display apparatus according to another embodiment.

FIG. 10 is a flowchart illustrating a method of manufacturing a display apparatus according to another embodiment. In more detail, FIG. 10 shows a method of manufacturing a display apparatus for discharging droplets including quantum dots after discharging a droplet including scatterers.

In operation 1010, the discharge unit 700 may discharge a third droplet including scatterers into the first opening 501, the second opening 502, and the third opening 503 of the upper substrate 400. For example, the third droplet may include the third scatterer 437.

In operation 1020, the discharge unit 700 may discharge a first droplet including quantum dots into the first opening 501 of the upper substrate 400. In the method of manufacturing a display apparatus according to an embodiment, the first droplet may not include scatterers. For example, the first droplet may include the first quantum dot 418 and may not include the first scatterer 417.

In operation 1030, the discharge unit 700 may discharge a second droplet including quantum dots into the second opening 502 of the upper substrate 400. In the method of manufacturing a display apparatus according to an embodiment, the second droplet may not include scatterers. For example, the second droplet may include the second quantum dot 428 and may not include the second scatterer 427.

Even if the first droplet and the second droplet including quantum dots are discharged after discharging the third droplet including scatterers, the first droplet and the second droplet including quantum dots do not include scatterers, and because the third droplet including scatterers is discharged from both the first nozzle 710 and the second nozzle 720 of the discharge unit 700 at the same time, there is no difference between the degree of precipitation of scatterers which occurs inside the first nozzle 710 and the degree of precipitation of scatterers which occurs inside the second nozzle 720. As a result, because the concentrations of scatterers in all pixels of the display apparatus 1 are the same or similar, a stain is not generated in an image displayed by the display apparatus 1.

Figure 11:
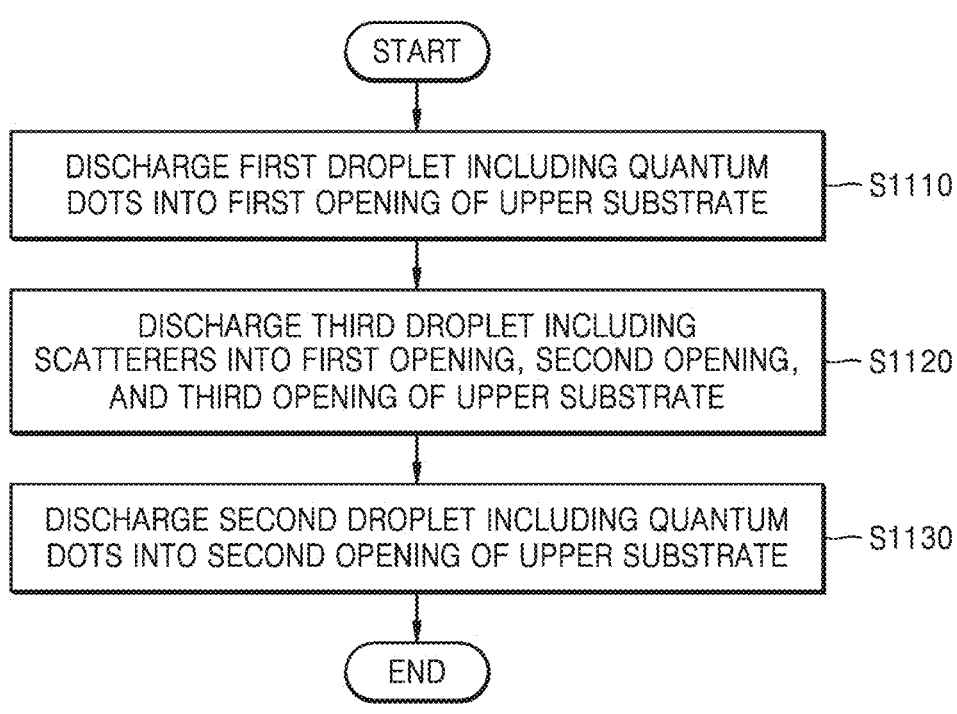
FIG. 11 is a flowchart illustrating a method of manufacturing a display apparatus according to still another embodiment.

FIG. 11 is a flowchart illustrating a method of manufacturing a display apparatus according to still another embodiment. In more detail, FIG. 11 shows a method of manufacturing a display apparatus in which a droplet including quantum dots is discharged, a droplet including scatterers are discharged, and then a droplet including quantum dots are discharged.

In operation 1110, the discharge unit 700 may discharge a first droplet including quantum dots into the first opening 501 of the upper substrate 400. In the method of manufacturing a display apparatus according to an embodiment, the first droplet may not include scatterers. For example, the first droplet may include the first quantum dot 418 and may not include the first scatterer 417.

In operation 1120, the discharge unit 700 may discharge a third droplet including scatterers into the first opening 501, the second opening 502, and the third opening 503 of the upper substrate 400. For example, the third droplet may include the third scatterer 437.

In operation 1130, the discharge unit 700 may discharge a second droplet including quantum dots into the second opening 502 of the upper substrate 400. In the method of manufacturing a display apparatus according to an embodiment, the second droplet may not include scatterers. For example, the second droplet may include the second quantum dot 428 and may not include the second scatterer 427.

Even if the first droplet including quantum dots is discharged, the third droplet including scatterers are discharged, and then the second droplet including quantum dots are discharged, the first droplet and the second droplet including quantum dots do not include scatterers, and because the third droplet including scatterers is discharged from both the first nozzle 710 and the second nozzle 720 of the discharge unit 700 at the same time, there is no difference between the degree of precipitation of scatterers which occurs inside the first nozzle 710 and the degree of precipitation of scatterers which occurs inside the second nozzle 720. As a result, because the concentrations of scatterers in all pixels of the display apparatus 1 are the same or similar, a stain is not generated in an image displayed by the display apparatus 1.

According to embodiments of the disclosure as described above, a display apparatus with a reduced possibility of occurrence of defects in a manufacturing process may be implemented. However, the scope of the disclosure is not limited to the effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
   discharging a first droplet including quantum dots into a first opening of a substrate;
   discharging a second droplet including quantum dots into a second opening of the substrate; and
   after discharging the first droplet and the second droplet, discharging a third droplet including scatterers into the first opening, the second opening, and a third opening of the substrate,
   wherein the first droplet or the second droplet does not include any scatterers.

2. The method of claim 1, wherein the discharging of the third droplet comprises discharging different amounts of the third droplet into the first opening, the second opening, and the third opening, respectively.

3. The method of claim 2, wherein the discharging of the third droplet further comprises discharging the third droplet into the third opening in an amount greater than an amount of the third droplet discharged into each of the first opening and the second opening.

4. The method of claim 1, wherein the third droplet does not include any quantum dots.

5. A method of manufacturing a display apparatus, the method comprising:

discharging a first droplet including quantum dots into a first opening of a substrate;

discharging a second droplet including quantum dots into a second opening of the substrate; and after discharging the first droplet and the second droplet, discharging a third droplet including scatterers into the first opening, the second opening, and a third opening of the substrate, wherein the first opening is provided in plurality, and wherein the discharging of the first droplet comprises:

discharging the first droplet from a discharge unit into the first opening of a first area of the substrate while moving any one of the discharge unit and the substrate in a first direction;

after discharging the first droplet, moving any one of the discharge unit and the substrate in a second direction intersecting the first direction; and after moving the any one of the discharge unit and the substrate in the second direction, discharging the first droplet from the discharge unit into the first opening of a second area of the substrate while moving any one of the discharge unit and the substrate in the first direction.

6. The method of claim 5, wherein the discharge unit comprises a first nozzle and a second nozzle, wherein the discharging of the first droplet into the first opening of the first area comprises discharging the first droplet from the first nozzle of the discharge unit into the first opening of the first area of the substrate, and the discharging of the first droplet into the first opening of the second area comprises discharging the first droplet from the second nozzle of the discharge unit into the first opening of the second area of the substrate.

7. A method of manufacturing a display apparatus, the method comprising:

discharging a first droplet including quantum dots into a first opening of a substrate;

discharging a second droplet including quantum dots into a second opening of the substrate; and after discharging the first droplet and the second droplet, discharging a third droplet including scatterers into the first opening, the second opening, and a third opening of the substrate, wherein a discharge unit comprises a first nozzle and a second nozzle, and wherein the discharging of the third droplet comprises discharging the third droplet from the first nozzle of the discharge unit into the first opening and the second opening of the substrate and discharging the third droplet from the second nozzle of the discharge unit into the third opening of the substrate.

8. The method of claim 7, wherein the first droplet or the second droplet does not include any scatterers.

9. A method of manufacturing a display apparatus, the method comprising:

discharging a third droplet including scatterers into a first opening, a second opening, and a third opening of a substrate;

after discharging the third droplet, discharging a first droplet including quantum dots into the first opening of the substrate; and after discharging the third droplet, discharging a second droplet including quantum dots into the second opening of the substrate.

10. A method of manufacturing a display apparatus, the method comprising:

discharging a first droplet including quantum dots into a first opening of a substrate;

after discharging the first droplet, discharging a third droplet including scatterers into a first opening, a second opening, and a third opening of the substrate; and after discharging the third droplet, discharging a second droplet including quantum dots into the second opening of the substrate.

\* \* \* \* \*